(12) United States Patent
Suga et al.

(10) Patent No.: US 7,160,820 B2
(45) Date of Patent: Jan. 9, 2007

(54) METHOD OF PREPARING OXIDE CRYSTAL FILM/SUBSTRATE COMPOSITE AND SOLUTION FOR USE THEREIN

(75) Inventors: Toshihiro Suga, Obu (JP); Yasuji Yamada, Matsue (JP); Toshihiko Maeda, Kawasaki (JP); Seok Beom Kim, Okayama (JP); Haruhiko Kurosaki, Nagoya (JP); Yutaka Yamada, Nagoya (JP); Izumi Hirabayashi, Tokyo (JP); Yasuhiro Iijima, Tokyo (JP); Tomonori Watanabe, Nagoya (JP); Hisashi Yoshino, Tokyo (JP); Koji Muranaka, Amagasaki (JP)

(73) Assignees: International Superconductivity Technology Center, the Juridical Foundation, Tokyo (JP); Fujikura Ltd., Tokyo (JP)

( * ) Notice: Subject to any disclaimer, the term of this patent is extended or adjusted under 35 U.S.C. 154(b) by 326 days.

(21) Appl. No.: 10/478,063

(22) PCT Filed: May 15, 2002

(86) PCT No.: PCT/JP02/04686

§ 371 (c)(1),
(2), (4) Date: Jun. 7, 2004

(87) PCT Pub. No.: WO02/101123

PCT Pub. Date: Dec. 19, 2002

(65) Prior Publication Data

US 2004/0214450 A1   Oct. 28, 2004

(30) Foreign Application Priority Data

May 15, 2001   (JP) .............................. 2001-144534
May 15, 2001   (JP) .............................. 2001-144541

(51) Int. Cl.
H01L 21/31     (2006.01)
H01L 21/469    (2006.01)

(52) U.S. Cl. .................. 438/779; 438/613; 257/741

(58) Field of Classification Search ............... 438/613, 438/618, 632, 634, 636, 779; 257/741, 746, 257/748
See application file for complete search history.

(56) References Cited

U.S. PATENT DOCUMENTS

| 5,077,271 | A  |   | 12/1991 | Hiskes et al. |
| 5,786,533 | A  |   | 7/1998  | Newman |
| 5,817,172 | A  |   | 10/1998 | Yamada et al. |
| 5,962,374 | A  |   | 10/1999 | Niiori et al. |
| 5,974,336 | A  |   | 10/1999 | Yamada et al. |
| 6,613,463 | B1 | * | 9/2003  | Izumi et al. ................ 428/700 |

FOREIGN PATENT DOCUMENTS

| EP | 0 837 513    | 4/1998  |
| EP | 0 884 787    | 12/1998 |
| JP | 2-204390     | 8/1990  |
| JP | 9-124396     | 5/1997  |
| JP | 10-125148    | 5/1998  |
| JP | 10-231121    | 9/1998  |
| JP | 11-3620      | 1/1999  |
| JP | 2001-114518  | 4/2001  |
| JP | 2002-104900  | 4/2002  |
| JP | 2002-279838  | 9/2002  |
| WO | WO97/39306   | 10/1997 |

OTHER PUBLICATIONS

I. Hirabayashi et al., "High Growth Rate Deposition Techniques for Coated Conductors: Liquid Phase Epitaxy and Vapor-Liquid-Solid Growth," *IEEE Transactions on Applied Superconductivity*, vol. 9, No. 2, pp. 1979-1982, Jun. 1999.

Y Yamada, "Liquid-Phase Epitaxy Processing of $RBa_2Cu_3O_{-\delta}$," *Supercond. Sci. Technol.*, vol. 13, No. 1, pp. 82-87, Jan. 2000.

* cited by examiner

Primary Examiner—Phuc T. Dang
(74) Attorney, Agent, or Firm—Kolisch Hartwell, P.C.

(57) ABSTRACT

There is provided a process for preparing a composite material of an oxide crystal film and a substrate by forming a Y123 type oxide crystal film from a solution phase on a substrate using a liquid phase method, wherein problems such as cracking of the oxide crystal film, separation of the oxide crystal film from the substrate, and development of a reaction layer between the substrate and the solution can be minimized. The solvent for forming the solution phase uses either a $BaO$—$CuO$—$BaF_2$ system or a $BaO$—$CuO$—$Ag$—$BaF_2$ system, and when the substrate with a seed crystal film bonded to the surface is brought in contact with the solution to form (grow) the oxide crystal film on the substrate, the temperature of the solution is controlled to a temperature of no more than 850° C.

17 Claims, 4 Drawing Sheets

METHOD OF PREPARING OXIDE CRYSTAL FILM/SUBSTRATE COMPOSITE AND SOLUTION FOR USE THEREIN

This application is a 371 of PCT/JP02/04686 filed May 15, 2002.

TECHNICAL FIELD

The present invention relates to a process for preparing a composite material of an oxide crystal film and a substrate by growing an oxide crystal film with a Y123 type crystal structure from a solution phase onto a substrate, using a liquid phase method. In particular, the invention relates to a process that contributes to improvements in the productivity of the oxide crystal film and substrate composite material, and improvements in the quality of the crystals of the oxide crystal film.

BACKGROUND ART

Examples of known solvents used in the preparation of an oxide crystal film with a Y123 type crystal structure on top of a substrate, for example in a process in which a $YBa_2Cu_3O_{6+d}$ crystal film (hereafter abbreviated as a "YBCO film") is grown from a solution by a liquid phase method (such as a crystal pulling type method using a solution), include BaO—CuO, BaO—CuO—$BaF_2$, and BaO—CuO—$BaF_2$—Ag (see "Supercond. Sci. Technol., 13(2000)" pp 82–87, printed in the U.K.).

With conventional solvent compositions and atmospheric conditions, the minimum temperature for film formation was limited to approximately 860° C. (see the above reference).

In film formation from a solution phase using a liquid phase method, typically a seed crystal film must first be formed on the surface of the substrate. This seed crystal film acts as a seed for crystal film growth, and also performs the function of protecting the substrate from the highly reactive solution. However, the inventors of the present invention have discovered that if the film formation temperature is too high, the seed crystal can break down, and in severe cases, the substrate being used can react with the solution, making the growing and preparation of a high quality crystal film on the substrate impossible.

For example, in YBCO film formation using an Ag—Cu alloy substrate, when the solution temperature was 920° C., a reaction layer between the substrate and the solution developed between the YBCO film and the substrate, and this reaction layer caused the YBCO film to be more prone to cracking. At solution temperatures exceeding 860° C., for example during film formation at 880° C., almost no reaction layer developed, but regions in which the YBCO film did not form were observed.

When a Ni substrate that had been covered with a nickel oxide (NiO) film by surface oxidation was used, film formation at a set solution temperature of either 920° C. or 880° C. resulted in a partial formation of a reaction layer between the substrate and the solution, although this reaction layer formation was less pronounced in the film formation at 880° C.

When an oxide substrate comprising a polycrystalline yttria stabilized zirconia (YSZ) was used, for film formation at temperatures in the vicinity of 880° C., reaction between the substrate and the solution resulted in film separation if the film formation process was conducted over an extended time period. Furthermore, when Hastelloy (a brand name of Haynes Stellite Inc., a Ni based corrosion resistant alloy) with an oriented YSZ intermediate layer was used as a substrate, cracks developed in the YBCO film with a set solution temperature of 860° C.

DISCLOSURE OF THE INVENTION

In view of the circumstances described above, an object of the present invention is to provide a process for preparing a composite material of an oxide crystal film and a substrate by forming a Y123 type oxide crystal film on a substrate using a liquid phase method (liquid phase epitaxy (LPE)), wherein problems such as cracking of the oxide crystal film, separation of the oxide crystal film from the substrate, and development of a reaction layer between the substrate and the solution can be minimized, and to also provide a solution used in such a process.

A process for preparing a composite material of an oxide crystal film and a substrate according to the present invention achieves the above object in the manner described below.

Namely, the present invention provides a process for preparing a composite material of an oxide crystal film and a substrate, by bringing a substrate with a seed crystal film formed on the surface thereof into contact with a solution comprising the elements for forming an oxide with a Y123 type crystal structure, and growing an oxide crystal film with a Y123 type crystal structure on the substrate, wherein a BaO—CuO—$BaF_2$ system or a BaO—CuO—Ag—$BaF_2$ system is used as the solvent for forming the aforementioned solution, and the temperature of the solution is controlled to a temperature of no more than 850° C.

By setting the solution temperature to a value of no more than 850° C., a high quality Y123 type oxide crystal film (that is unlikely to display cracking or separation) can be prepared. In other words, in cases where the oxide crystal film is a superconducting film, a superconductor with a high critical temperature and a large critical current density can be obtained. The reasons for this finding are that by setting the solution temperature to a lower temperature than conventional values, reaction between the substrate and the seed crystal film is inhibited, separation of the seed crystal film is prevented, and a reaction layer is not formed on top of the substrate.

The Ba/Cu atom ratio in the solvent composition used in the process for preparing a composite material of an oxide crystal film and a substrate according to the present invention is typically within a range from approximately 35/65 to 22/78, and preferably from approximately 32/68 to 25/75. By ensuring that the Ba/Cu atom ratio falls within this range, the solution temperature reduction effect described above can be realized, enabling crystal growth to proceed at no more than approximately 850° C. (see example 7 and FIG. 3). Furthermore, if Ag is also added, as per the second of the two solvents described above, then the temperature reduction effect is even more pronounced, and by using a Ag concentration that represents a saturated concentration, this Ag addition effect becomes even more significant.

Furthermore, the solution comprises the aforementioned solvent (either a BaO—CuO—$BaF_2$ system or a BaO—CuO—Ag—$BaF_2$ system), and the elements for forming the Y123 type oxide as solutes.

Furthermore, when the temperature is cooled from the crystal growing temperature down to room temperature, or down to a temperature at which the crystal is used, thermal stress develops, although it is already known that the amount of thermal stress that develops reduces as the temperature difference is reduced. Accordingly, the present invention also displays a thermal stress reduction effect.

In the above process for preparing a composite material of an oxide crystal film and a substrate, the oxygen concentration in the crystal growing atmosphere is preferably within a range from approximately $1\times10^{-2}$ to 5 mol %, and even more preferably from approximately $5\times10^{-2}$ to 2 mol %, and most preferably from $1\times10^{-1}$ to 1.5 mol %. The lower this oxygen concentration becomes, the easier it is to achieve a temperature reduction effect (an effect in which the temperature for the Y123 type crystal film formation can be lowered, and as a result, reaction between the solution and the substrate can be inhibited), although at concentrations less than approximately $1\times10^{-2}$ mol %, the Y123 type crystal will not grow (see example 5 and FIG. 1).

In the above process for preparing a composite material of an oxide crystal film and a substrate, the substrate preferably uses a metal substrate selected from a group consisting of Ni, Ag, Ni based alloys, and Ag based alloys, or alternatively a composite metal substrate comprising a metal substrate, with a core formed from an Fe based alloy or a Ni based alloy different from the metal substrate provided therein. In addition, the use of composite substrates in which an oxide film is formed on top of either a metal substrate or a composite metal substrate as described above, or a semiconductor comprising silicon and GaN, by a physical vapor deposition (PVD) method, a surface oxidation method or a chemical vapor deposition (CVD) method, using an oxide selected from a group consisting of MgO, $LaAlO_3$, $Al_2O_3$, $SrTiO_3$, yttria stabilized $ZrO_2$, $CeO_2$, $Y_2O_3$, and NiO, is particularly desirable. Furthermore, the aforementioned substrate can also utilize non-metallic substrates formed from MgO, $LaAlO_3$, $Al_2O_3$, $SrTiO_3$, $Sr_2AlTaO_6$, $(La_{1-x}Sr_x)_2AlTaO_6$ (wherein, $0\leq x<1$), yttria stabilized $ZrO_2$, $CeO_2$, $Y_2O_3$, NiO, $Si_3N_4$, or combinations thereof.

Ni, Ag, Ni based alloys, and Ag based alloys display excellent corrosion resistance at high temperatures, and are ideally suited to use as substrates in film formation processes conducted at temperatures of 800° C. or higher. Furthermore, Fe based alloys and Ni based alloys display superior strength, and also offer excellent corrosion resistance at high temperatures. As a result, using an Fe based alloy or a Ni based alloy as the core makes it easier to achieve good mechanical strength for the metal substrate, and is advantageous in terms of increasing the surface area or the length of a superconducting member. In addition, by forming a film of an oxide selected from a group consisting of MgO, $LaAlO_3$, $Al_2O_3$, $SrTiO_3$, yttria stabilized $ZrO_2$, $CeO_2$, $Y_2O_3$, and NiO on top of the metal substrate or composite metal substrate, as a backing film for the seed crystal film, formation of the seed film becomes easier. By so doing, reaction between the seed crystal and the substrate at high temperatures can be inhibited, formation of a YBCO film by a liquid phase method can be performed with good reliability, and the properties of the crystal film can be improved.

If a composite substrate in which an oxide film is formed on top of a semiconductor comprising silicon or GaN by a physical vapor deposition (PVD) method or a chemical vapor deposition (CVD) method, using an oxide selected from a group consisting of MgO, $LaAlO_3$, $Al_2O_3$, $SrTiO_3$, yttria stabilized $ZrO_2$, $CeO_2$, $Y_2O_3$, and NiO, is used as the substrate, then formation of the seed film becomes easier. As a result, reaction between the seed crystal and the substrate at high temperatures can be inhibited, formation of a YBCO film by a liquid phase method can be performed with good reliability, the properties of the crystal film can be improved, and moreover, increases in the surface area of the Y123 type crystal film become feasible, and increased performance can be realized by combining superconductivity with semiconductor devices.

If a non-metallic substrate formed from MgO, $LaAlO_3$, $Al_2O_3$, $SrTiO_3$, $Sr_2AlTaO_6$, $(La_1Sr)_2AlTaO_6$, yttria stabilized $ZrO_2$, $CeO_2$, $Y_2O_3$, NiO, $Si_3N_4$, or a combination thereof is used as the substrate, then potential advantages include reaction inhibition, easier formation of the seed film, increased surface area, and improved characteristics in RF applications of the superconducting film.

The aforementioned PVD method can utilize any one of laser ablation, sputtering, electron beam deposition, ion beam assisted deposition and resistance heating deposition.

The seed crystal is preferably a crystal film of: an oxide with a Y123 type crystal structure containing either an oxide with a composition represented by $Ln_{1+y}Ba_{2-y}Cu_3O_{6+d}$ (wherein, Ln represents a positive ion element selected from a group consisting of Y, La, Pr, Nd, Sm, Eu, Gd, Dy, Ho, Er, Tm, Yb, and Lu, $0\leq y\leq 1$, and $0\leq d\leq 1.5$), or an oxide with a composition represented by $(Y_{x1}Ca_{x2}La_{x3}Pr_{x4}Nd_{x5}Sm_{x6}Eu_{x7}Gd_{x8}Dy_{x9}Ho_{x10}Er_{x11}Tm_{x12}Yb_{x13}Lu_{x14})_{1+y}Ba_{2-y}Cu_3O_{6+d}$ (wherein, x1 to x14 are each at least 0, but no more than 1, x1+x2+ . . . +x14=1, and at least two of x1 to x14 are values other than 0, $0\leq y\leq 1$, and $0\leq d\leq 1.5$); an oxide with a $K_2NiF_4$ type structure containing an oxide represented by $La_2CuO_4$, $Nd_2CuO_4$, $LaSrFeO_4$, or $LaSrGaO_4$; an oxide with a perovskite type structure containing an oxide represented by $NdGaO_3$ or $LaGaO_3$; or an oxide containing $Y—Ba_2Fe_2O_5$, which represents a solid state solution of a rare earth element in $Ba_2Fe_2O_5$.

Specific examples of the composition of Y123 type crystal structures include (1) $(Y_{x1}Ca_{x2}La_{x3}Pr_{x4}Nd_{x5}Sm_{x6}Eu_{x7}Gd_{x8}Dy_{x9}Ho_{x10}Er_{x11}Tm_{x12}Yb_{x13}Lu_{x14})_{1+y}Ba_{2-y}Cu_3O_{6+d}$ (wherein, x1 to x14 are each at least 0, but no more than 1, x1+x2+ . . . +x14=1, and at least two of x1 to x14 are values other than 0, $0\leq y\leq 1$, and $0\leq d\leq 1.5$) type structures, and preferably $(Ln_{1-x}Ln'_x)_{1+y}Ba_{2-y}Cu_3O_{6+d}$ (wherein, Ln and Ln' are different, and each represents a positive ion element selected from a group consisting of Y, Ca, La, Pr, Nd, Sm, Eu, Gd, Dy, Ho, Er, Tm, Yb, and Lu, $0<x<1$, $0\leq y\leq 1$, and $0\leq d\leq 1.5$) type structures, or (2) $Ln_{1+y}Ba_{2-y}Cu_3O_{6+d}$ (wherein, Ln represents a positive ion element selected from a group consisting of Y, La, Pr, Nd, Sm, Eu, Gd, Dy, Ho, Er, Tm, Yb, and Lu, $0\leq y\leq 1$, and $0\leq d\leq 1.5$) type structures.

The present invention also provides a solution for use in a process for preparing a composite material of an oxide crystal film and a substrate, by bringing a substrate with a seed crystal film formed on the surface thereof into contact with a solution comprising elements for forming an oxide with a Y123 type crystal structure, and growing an oxide crystal film with a Y123 type crystal structure on the substrate, wherein the solvent used to form the solution is a BaO—CuO—$BaF_2$ system or a BaO—CuO—Ag—$BaF_2$ system, and the Ba/Cu atom ratio of the solvent is within a range from approximately 35/65 to 22/78.

The meanings of the terms solvent, solute, and solution are identical with the meanings described above in relation to the process for preparing a composite material of an oxide crystal film and a substrate according to the present invention.

The Ba/Cu atom ratio is typically within a range from approximately 35/65 to 22/78, and preferably from approximately 32/68 to 25/75. By ensuring that the Ba/Cu atom ratio falls within this range, the solution temperature reduction effect described above can be realized, enabling crystal growth to proceed at no more than approximately 850° C. (see example 7 and FIG. 3). Furthermore, if Ag is also added, as per the second of the two solvents described above, then the temperature reduction effect is even more pronounced, and by using a Ag concentration that represents a saturated concentration, this Ag addition effect becomes even more significant.

Crystal growth using a solution of the present invention can be conducted at a low temperature that essentially prevents reaction between the crucible and the solution, meaning that changes in the solution composition resulting from such reaction, and leakage of the solution are effectively non-existent. Accordingly, problems such as deterioration in the crystal quality due to changes in the solution composition, or halting of the crystal growth due to solution leakage do not arise. Furthermore, the temperature difference between the crystal growth temperature and the external temperature decreases, making control of the growing temperature easier and suggesting further improvements in crystal quality can be expected, and because the crystal growth occurs at a lower temperature, reductions in power consumption can also be expected.

In addition, because an oxide crystal with good crystallinity can be grown over a long period, the same crucible can be used for many repetitions of the oxide crystal growing process.

Moreover, when the temperature is cooled from the crystal growing temperature down to room temperature, or down to a temperature at which the crystal is used, thermal stress develops, although the amount of thermal stress that develops reduces as the temperature difference is reduced, meaning the present invention also displays a thermal stress reduction effect.

The $BaF_2$ molar percentage in a solvent composition of the present invention is preferably within a range from approximately $5 \times 10^{-2}$ to 2 mol %, and even more preferably from approximately $8 \times 10^{-2}$ to 1.5 mol %, and most preferably from $2 \times 10^{-1}$ to 1 mol % (see example 6 and FIG. 2). If the quantity of $BaF_2$ is too small, then realizing a temperature reduction effect is difficult, whereas if the quantity of $BaF_2$ is too large, $BaF_2$ crystals are more likely to adhere to the Y123 type crystal.

In those cases in which the solvent composition includes Ag, an even better temperature reduction effect can be achieved, and using a saturated Ag concentration produces the most marked Ag addition effect.

BEST MODE FOR CARRYING OUT THE INVENTION

Figure 1:
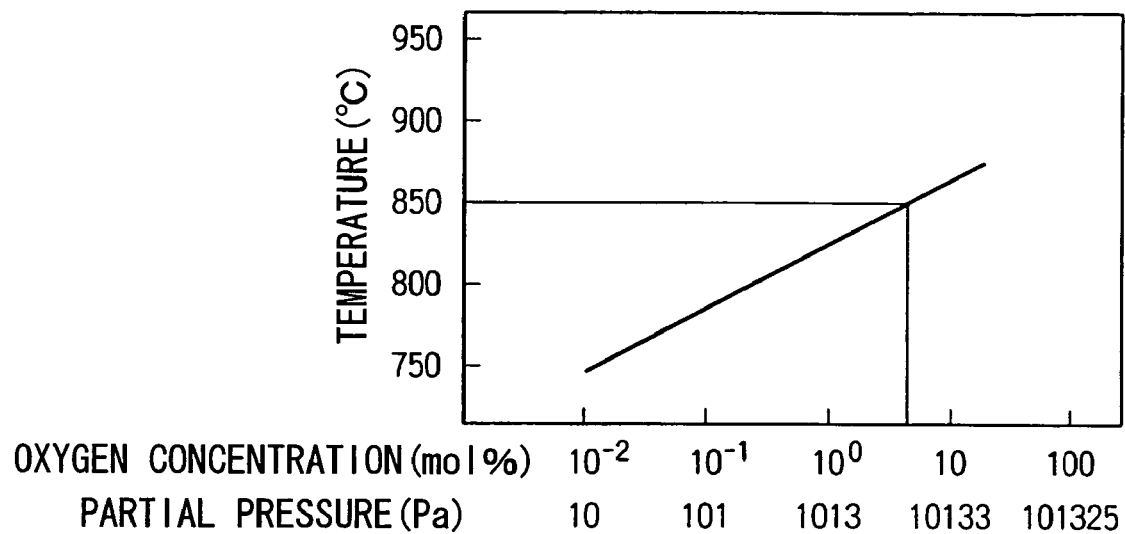
FIG. 1 is a graph showing the relationship between oxygen concentration and the minimum temperature at which crystal growth is possible, for formation of a YBCO film by a liquid phase method (LPE method).

As follows is a more detailed description of the present invention, based on a series of examples and comparative examples. The yttria crucible and the magnesia container used were of the dimensions shown below.

Yttria crucible: external diameter 60 mm, internal diameter 50 mm, internal height 45 mm.

Magnesia container: external diameter 70 mm, internal diameter 62 mm, internal height 50 mm.

Furthermore, YBCO crystals were used as examples of Y123 type crystals, although the present invention is not restricted to YBCO crystals. In the examples below, the liquid phase method employed involved growing the crystals using a pulling type method (specifically a rotation pulling method) from amongst the different solution based growing methods, although other solution methods such as a Cyprus method or a partially molten type method can also be used to grow crystals using a solution of the present invention.

COMPARATIVE EXAMPLE 1

20 g of $Y_2BaCuO_5$ (hereafter abbreviated as "Y211"), and 180 g of a powdered mixture of $BaCuO_2$ and CuO, in which the Ba/Cu atom ratio was 3/5 (hereafter abbreviated as "Ba3/Cu5 powder"), were used as starting raw materials. These raw materials were placed in an yttria crucible. During filling of the crucible, the Y211 powder was first packed into the bottom of the crucible, and the Ba3/Cu5 powder was then placed on top. The filled yttria crucible was inserted into a magnesia container, placed in an atmosphere controlled electric furnace, and heated to 1000° C. The crucible was held at this temperature for 48 hours to melt the raw materials. During this 48 hour period, the Y211 and the molten liquid reacted, forming YBCO crystals and producing sedimentation in the bottom of the crucible. At this point, the solution was a liquid comprising YBCO as a solute and molten BaO—CuO as the solvent, and the Ba/Cu atom ratio was 37.5/62.5. Subsequently, using a MgO single crystal substrate with a YBCO thin film formed thereon by pulsed laser deposition as a seed crystal, this seed crystal was contacted with the solution, and YBCO crystal growth was carried out. When the growing was conducted in an atmosphere with an oxygen concentration of 1 mol %, the minimum temperature at which a good YBCO crystal could be grown was 930° C. At temperatures lower than 930° C., a YBCO crystal and a $BaCuO_2$ crystal crystallized simultaneously.

When 4 g of $BaF_2$ and 3.1 g of CuO was added to the solution, the minimum temperature at which a good YBCO crystal could be grown in an atmosphere with an oxygen concentration of 1 mol % fell to 880° C. Furthermore, when excess Ag (25 g) was also added, the minimum temperature for good YBCO crystal growth fell further to 860° C. These growing temperatures were the same as those mentioned in the report described above.

However, the solution reacts with the yttria crucible, causing a reduction in the quantity of solution, and this reaction also causes the solution to creep up the surface of the crucible and leak from the crucible. As a result, crystal growth stops prematurely. In other words, crystal growth cannot be continued. The maximum crystal growing time at a temperature of 930° C. or higher was, on average, from 1 to 2 weeks, and at a temperature within a range from 860 to 930° C., was approximately 2 weeks.

COMPARATIVE EXAMPLE 2

4 g of Y211, 177 g of Ba3/Cu5 powder, and 31.5 g of CuO were used as starting raw materials. These raw materials were placed in an yttria crucible. During filling of the crucible, the Y211 powder was first packed into the bottom of the crucible, and a mixture of the Ba3/Cu5 powder and the CuO was then placed on top. The filled yttria crucible was inserted into a magnesia container, placed in an atmosphere controlled electric furnace, and heated to 920° C. The crucible was held at this temperature for 48 hours to melt the raw materials. During this 48 hour period, the Y211 and the molten liquid reacted, forming YBCO crystals (Y123 type crystals) and producing sedimentation in the bottom of the crucible. At this point, the solution was a liquid comprising YBCO as a solute and molten BaO—CuO as the solvent, and the Ba/Cu atom ratio was 30/70. Using a similar seed crystal to the comparative example 1, crystal growth was conducted in an atmosphere with an oxygen concentration of 1 mol %, and good YBCO crystal growth was possible at temperatures above 850° C.

EXAMPLE 1

When 3.6 g of $BaF_2$ and 3.95 g of CuO were added to the solution of the comparative example 2 to produce a Ba/Cu atom ratio of 30/70, and the atmospheric oxygen concentration was set at 1 mol %, the crystal growing temperature required to enable production of a good YBCO crystal was able to be reduced to 836° C.

EXAMPLE 2

In the example 1, by adding 30 g of Ag to the solution, the crystal growing temperature required to enable production of a good YBCO crystal, under conditions including a saturated Ag solution and an atmospheric oxygen concentration of 1 mol %, fell to 806° C. At temperatures below 806° C., both the targeted YBCO crystal and an unwanted $BaCuO_2$ crystal were grown simultaneously.

EXAMPLES 3, 4

In the procedure for preparing the solutions of the examples 1 and 2, at the stage of placing the raw materials in the crucible, either $BaF_2$, or $BaF_2$ and Ag respectively, were weighed out to ensure the correct solvent composition, subsequently placed in the crucible, and then heated to prepare the solution. Each solution was then used to grow a YBCO crystal. The crystal growing temperatures required to enable production of a good YBCO crystal fell to the same temperatures observed in the examples 1 and 2 respectively.

EXAMPLE 5

Using a solution with a Ba/Cu atom ratio of 30/70 prepared in the same manner as the example 2, and varying the oxygen partial pressure, the minimum temperature at which the YBCO crystal phase could be grown exclusively was investigated. The $BaF_2$ molar percentage within the solvent composition was 1 mol %.

The atmospheric partial pressure of oxygen was varied by mixing nitrogen gas into the atmosphere to vary the atmospheric oxygen concentration across a range from $10^{-2}$ to 10 mol % (oxygen partial pressure: 10 to 10130 Pa). As is evident from the results of these investigations shown in FIG. 1, it was discovered that the lower the oxygen concentration is, the lower the minimum temperature for growth becomes, although if the oxygen concentration is less than $10^{-2}$ mol %, the YBCO crystal did not grow.

EXAMPLE 6

Using a solution with a Ba/Cu atom ratio of 30/70 prepared in the same manner as the example 2, and varying the $BaF_2$ molar percentage within the solvent composition, the minimum temperature at which the YBCO crystal phase could be grown exclusively was investigated. The atmospheric oxygen concentration was set to 1 mol % (oxygen partial pressure: 1013 Pa).

The $BaF_2$ molar percentage within the solvent composition was varied within a range from $10^{-2}$ to 5 mol %.

Figure 2:
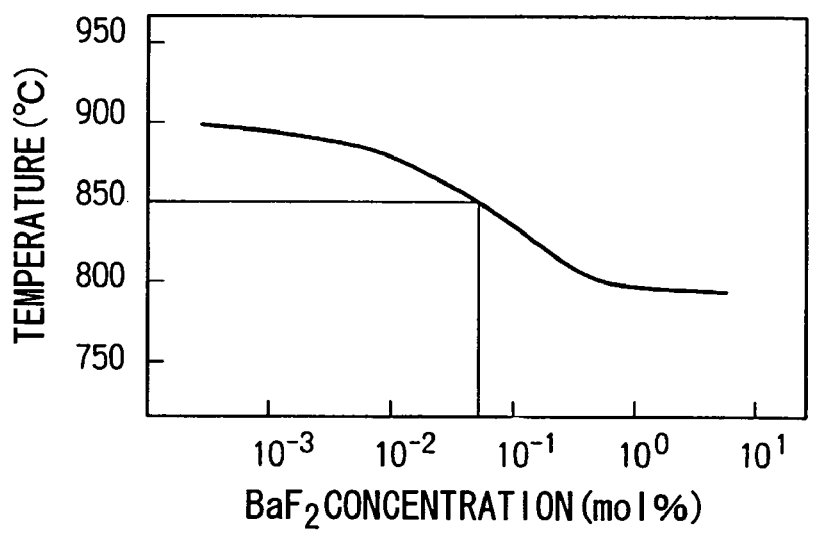
FIG. 2 is a graph showing the relationship between the $BaF_2$ molar percentage within a solvent composition and the minimum temperature at which crystal growth is possible, for formation of a YBCO film by a liquid phase method (LPE method).

As is evident from the results shown in FIG. 2, at $BaF_2$ molar percentage values less than $5 \times 10^{-2}$ mol %, the temperature reduction effect is minimal, whereas increasing the $BaF_2$ molar percentage beyond 1 mol % provides no further improvements in the temperature reduction effect. Furthermore, it was also discovered that if crystal growth is performed at temperatures less than 810° C., or crystal growth is performed at temperatures less than 840° C. and with a $BaF_2$ molar percentage value exceeding 2 mol %, then $BaF_2$ crystals tend to adhere to the surface of the YBCO crystal.

EXAMPLE 7

Using a similar method to the example 2, the Ba/Cu atom ratio was varied, and the minimum temperature at which the YBCO crystal phase could be grown exclusively was investigated.

The atmospheric oxygen concentration was set to 1 mol % (oxygen partial pressure: 1013 Pa), and the $BaF_2$ molar percentage within the solvent composition was set to 1 mol %. The Ba/Cu atom ratio was varied within a range from 50/50 to 10/90.

Figure 3:
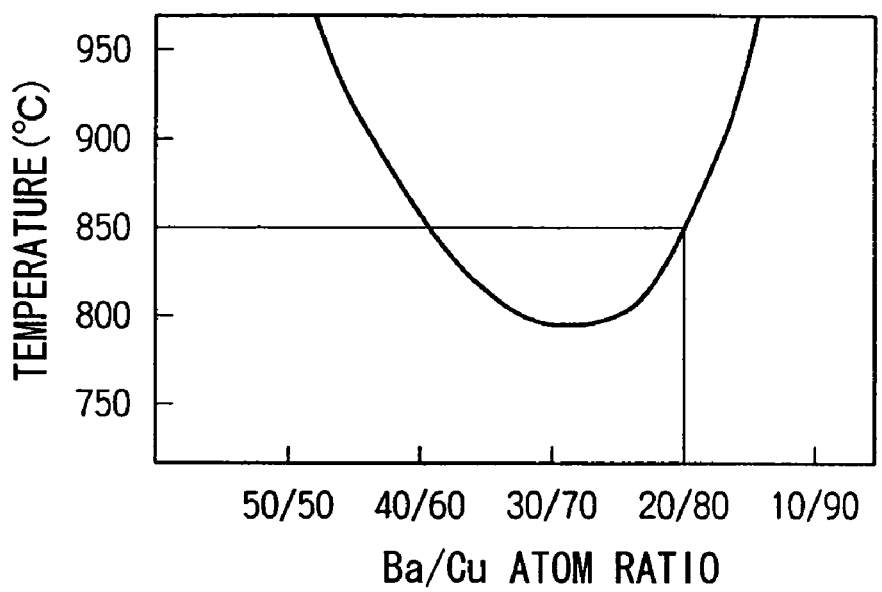
FIG. 3 is a graph showing the relationship between the Ba/Cu atom ratio and the minimum temperature at which crystal growth is possible, for formation of a YBCO film by a liquid phase method (LPE method).

As is evident from the results of this investigation shown in FIG. 3, if the quantity of Ba is greater than a Ba/Cu ratio of 37.5/62.5, then the minimum temperature for crystal growth exceeds 850° C. In contrast, if the quantity of Cu is greater than a Ba/Cu ratio of 20/80, then once again the minimum temperature for crystal growth exceeds 850° C.

EXAMPLE 8

For the solution compositions and the atmospheric conditions described in the examples 1 and 2, the relationship between the solution retention time and the fall in the surface of the solution was determined for crystal growth at 820° C. and 850° C. respectively. Even 4 weeks after commencing the tests, almost no fall in the solution surface level had been observed.

Figure 4:
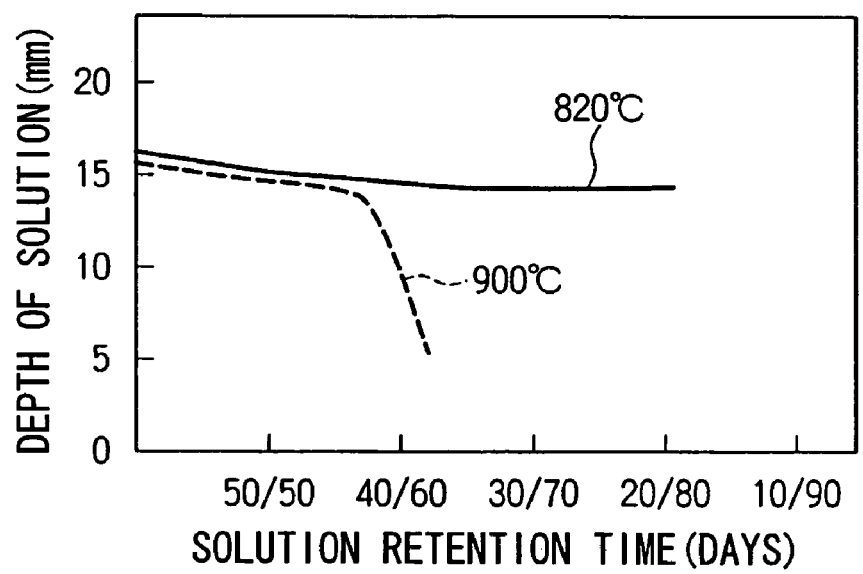
FIG. 4 is a graph showing the relationship between the height of the solution surface, which indicates the quantity of solution, and the retention time for the solution, for formation of a YBCO film by a liquid phase method (LPE method).

From the results in FIG. 4, which displays the time dependency of variations in the solution surface level, it is evident that the solution underwent almost no reaction with the crucible, and suffered almost no leakage from the crucible.

In contrast, during crystal growth at temperatures exceeding 930° C., measurement of the fall in the solution surface level showed almost no fall in the surface level for the first 10 days, but a rapid fall in the solution surface level thereafter, and in approximately 2 days the solution had leaked from the crucible.

<Evaluation of Superconductivity>

Using the solution from the example 2, a resistance temperature curve was produced using a DC four terminal method for a crystal grown on a MgO substrate at an atmospheric temperature of 821° C., which represents a temperature at which conventional YBCO growth has proved impossible.

Figure 5:
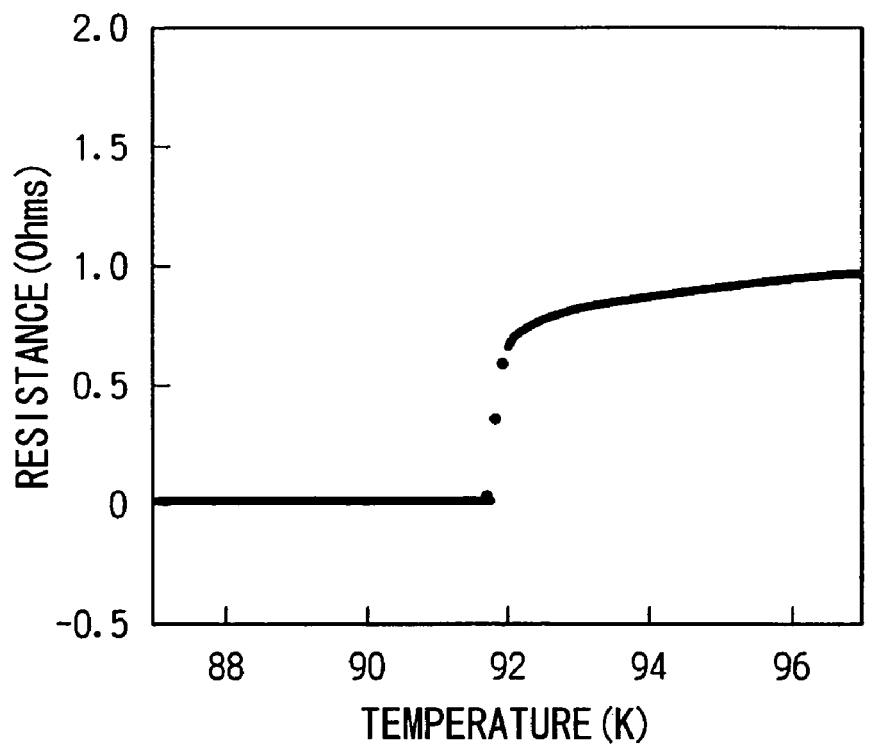
FIG. 5 is a resistance temperature curve for a YBCO film formed on a MgO substrate by an LPE method, measured using a DC four terminal method.

From the results of this investigation, which are shown in FIG. 5, it is evident that for the produced YBCO crystal, the resistance fell to zero at approximately 92 K, and the transition to a superconducting state occurred at a temperature exceeding 90 K. It is known that crystals which display a superconducting transition at this temperature are YBCO, thereby confirming that the formed crystal was a YBCO crystal.

As follows is a description of examples of composite materials of an oxide crystal film and a substrate.

<Preparation of a Seed Crystal Covered Substrate>

Using the process described below, a seed crystal film (YBCO) of 50 to 800 nm was used to cover (was bonded to) a variety of metal substrates and oxide substrates (each comprising a composite material: see Table 1 and Table 2). Using a KrF excimer laser (wavelength 248 nm), a pulsed laser was irradiated onto a YBCO target, generating a plume. At the same time, a substrate facing the target was heated to 650 to 850° C. using a back heater.

TABLE 1

Combinations of oxide substrates and oxide films formed thereon

| Substrate | Film | | | | | | |
|---|---|---|---|---|---|---|---|
| | MgO | LaAlO$_3$ | SrTiO$_3$ | Yttria stabilized ZrO$_2$ | CeO$_2$ | Y$_2$O$_3$ | NiO |
| MgO | — | ○ | ○ | ○ | ○ | ○ | ○ |
| LaAlO$_3$ | | — | | | | | |
| Al$_2$O$_3$ | | | | ○ | | | |
| SrTiO$_3$ | ○ | | — | | | | ○ |
| Yttria stabilized ZrO$_2$ | | | | — | | ○ | |
| NiO | ○ | | | | | | — |

The ○ symbol indicates a tested combination.

TABLE 2

Combinations of metal substrates and oxide films formed thereon

| Substrate | Film | | | |
|---|---|---|---|---|
| | MgO | Yttria stabilized ZrO$_2$ | CeO$_2$ | Y$_2$O$_3$ |
| Nickel | ○ | | ○ | ○ |
| Nickel based alloy (Hastelloy) | | ○ | ○ | ○ |
| Silver | | | | |
| Silver-copper alloy | | | | |

The ○ symbol indicates a tested combination.

EXAMPLE 9

Using the solution from the example 1, each of the aforementioned substrates with a bonded seed crystal film (Table 1) was contacted with the solution surface, and a YBCO film was formed at 820° C. This process is the same as the so-called "top seeded growth" process or a liquid phase epitaxy (LPE) process.

For all of the substrates, a composite material of a YBCO film and a substrate was obtained. Analysis of the cross-sections using both electron microscope observation and compositional analysis based on energy dispersive X-ray analysis confirmed that for all the different substrates, reaction between the substrate and the solution was either non-existent, or if present, was light and localized.

EXAMPLE 10

The solution prepared in the example 1 was used. Using a metalorganic chemical vapor deposition (MOCVD) method, a Y$_2$O$_3$ film was formed on top of an oriented Ni tape substrate with a NiO film prepared by surface oxidation epitaxy (SOE), and a seed film of YBa$_2$Cu$_3$O$_{7-x}$ (YBCO) was then formed thereon using a MOCVD method, and the resulting material was used as a substrate for crystal growth.

A YBCO film was formed from the solution phase at 820° C. using a liquid phase epitaxial method. The thickness of the Y$_2$O$_3$ film and the YBCO seed film were approximately 100 nm and 500 nm respectively. By conducting film formation for approximately 20 minutes, a YBCO film of approximately 1000 nm was obtained.

Figure 6:
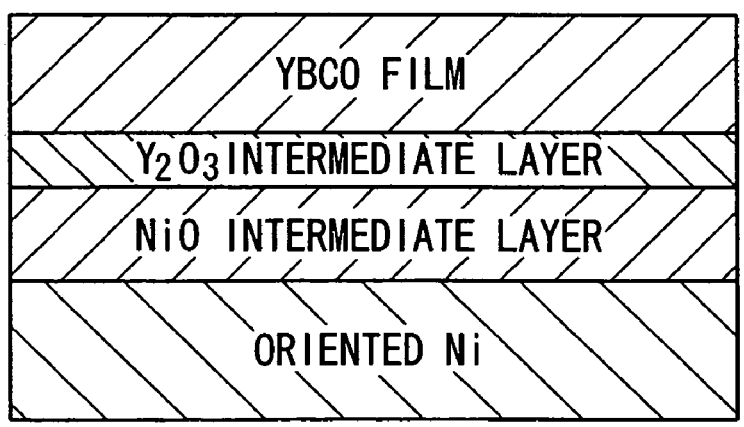
FIG. 6 is a schematic cross-sectional view showing the structure of a composite material of an oxide crystal film and a substrate, for the case in which a YBCO film is formed at 820° C. using an oriented Ni substrate.
Figure 7:
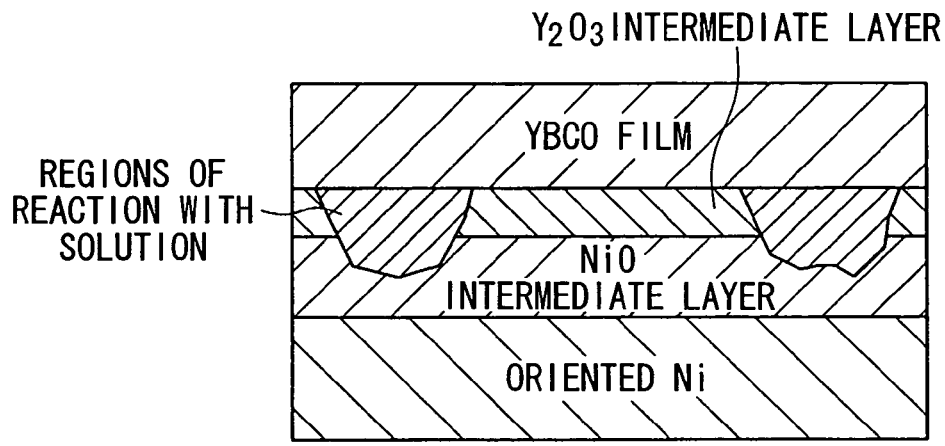
FIG. 7 is a schematic cross-sectional view showing the structure of a composite material of an oxide crystal film and a substrate, for the case in which a YBCO film is formed at 930° C. using an oriented Ni substrate.

Measurement of the superconducting critical temperature of the YBCO film using a DC four terminal method revealed a value of 85 K. Investigation of the cross section of the produced sample using a scanning electron microscope revealed erosion of the NiO as a result of reaction with the solution in a very few localized areas, but in most areas the intended composite material of the YBCO film and the substrate, with no reaction layer, was obtained, as shown in FIG. 6.

COMPARATIVE EXAMPLE 3

In order to confirm that the reduction in the formation temperature of the YBCO thick film is effective in reducing the reaction between the substrate and the solution used in the example 10, formation of the YBCO thick film was also carried out at temperatures higher than 820° C., namely at 930° C. and 880° C.

In order to realize these two film formation temperatures, the YBCO thick films were prepared under the following sets of conditions.

Conditions 1: A solvent with a composition of BaO:CuO:$BaF_2$=34.5:62.5:3, and saturated with Ag was used, the growing temperature was set at 930° C., and the growing atmosphere was a normal external atmosphere.

Conditions 2: A solvent with a composition of BaO:CuO=3:7, and saturated with Ag was used, the growing temperature was set at 880° C., and the film formation atmosphere was formed from a mixed gas of nitrogen and oxygen, with a total pressure of 101325 Pa (1 atmosphere), and an oxygen concentration of 1 mol % (partial pressure: 1013 Pa).

When the conditions 1 were used, film formation for approximately 2 minutes yielded a YBCO film of approximately 3000 nm, whereas when the conditions 2 were used, film formation for approximately 2 minutes yielded a YBCO film of approximately 2000 nm. Measurement of the superconducting critical temperature for each of the YBCO films using a DC four terminal method revealed values of 61 K for the YBCO film obtained under the conditions 1, and 70 K for the YBCO film obtained under the conditions 2. Furthermore, investigation of the cross section of the produced samples using a scanning electron microscope revealed that for the sample prepared under the conditions 1, the solvent had penetrated beneath the YBCO film causing partial erosion of the NiO, whereas in the case of the sample prepared under the lower growing temperature of the conditions 2, that type of solvent penetration had been suppressed.

Considering this finding in combination with the results of the example 2 suggests that the reaction suppression effect is due to the reduction in temperature of the LPE growing temperature.

EXAMPLE 11

A Ag—Cu alloy (Cu: 0.1% by weight, Ag: the balance) with a rolling orientation texture was prepared as a substrate, and a pulsed laser deposition method was then used to form a YBCO seed film of thickness 500 nm on the surface, and the resulting structure was used as a substrate.

Figure 8:
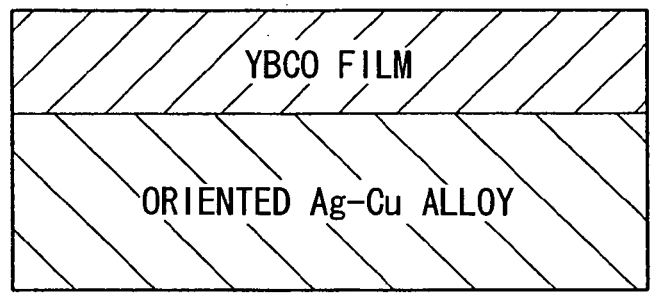
FIG. 8 is a schematic cross-sectional view showing the structure of a composite material of an oxide crystal film and a substrate, for the case in which a YBCO film is formed at 820° C. using an oriented Ag—Cu substrate.

The same LPE film formation conditions as those of the example 5 were used, namely, a solvent with a composition of BaO:CuO:$BaF_2$=29:70:1, and saturated with Ag was used, the growing temperature was set to 820° C., and the film formation atmosphere used a mixed gas of nitrogen and oxygen with a total pressure of 1 atmosphere and an oxygen concentration of 1 mol %. Conducting film formation for approximately 20 minutes yielded a YBCO film of approximately 1000 nm. Measurement of the superconducting critical temperature of the YBCO film using a DC four terminal method revealed a value of 90 K. Investigation of the cross section of the produced sample using a scanning electron microscope revealed that the intended structure comprising a composite material of the YBCO film and the substrate, with no reaction layer, had been obtained, as shown in FIG. 8.

COMPARATIVE EXAMPLE 4

In order to confirm that the reduction in the formation temperature of the YBCO thick film is effective in reducing the reaction between the substrate and the solution used in the example 11, formation of the YBCO thick film was also carried out at a temperature higher than 820° C., namely at 930° C. The LPE film formation conditions included using a solvent with a composition of BaO:CuO:$BaF_2$=34.5:62.5:3, and saturated with Ag, setting the growing temperature to 930° C., and setting the growing atmosphere to the normal external atmosphere. Conducting film formation for approximately 2 minutes yielded a YBCO film of approximately 3000 nm.

Figure 9:
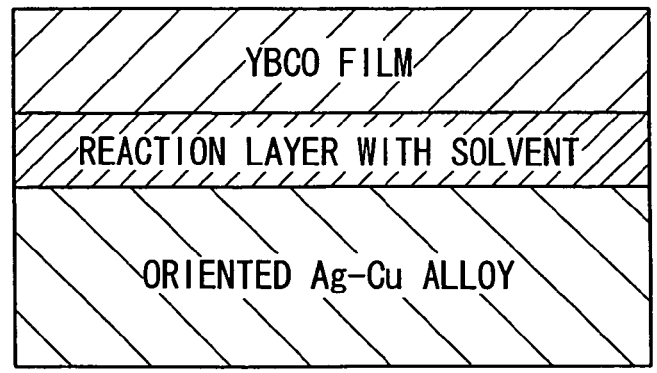
FIG. 9 is a schematic cross-sectional view showing the structure of a composite material of an oxide crystal film and a substrate, for the case in which a YBCO film is formed at 930° C. using an oriented Ag—Cu substrate.

Measurement of the superconducting critical temperature of the YBCO film using a DC four terminal method revealed a decrease in resistance, indicating a superconducting transition, at 90 K, but measurements performed at temperatures of 5 K and higher did not reveal zero resistance. Furthermore, investigation of the cross section of the produced sample using a scanning electron microscope revealed that the solvent had penetrated beneath the YBCO film, forming a reaction layer with the substrate, as shown in FIG. 9, and the YBCO film had also developed a multitude of cracks.

The results from the example 11 and the comparative example 4 show that as a result of the reduction in the growing temperature in the LPE method, the amount of reaction was reduced, and the occurrence of cracking was suppressed.

EXAMPLE 12

Using a combination of ion beam assisted deposition (IBAD) and ion beam sputtering, and a combination of inclined substrate deposition (ISD) and pulsed laser deposition (PLD), nickel based alloys (Hastelloy) with an yttria stabilized zirconia film formed on the surface thereof were prepared as substrates a and b respectively. In the case of the substrate a prepared using the combination of IBAD and sputtering, an additional $Y_2O_3$ film was subsequently formed on top to complete the substrate.

Using a PLD method, a YBCO seed film with a thickness of at least 500 nm was formed on each of the substrates a, b, thereby forming seed film bonded substrates.

Formation of a YBCO film was then conducted using the solution from the example 9, with an oxygen concentration of 1 mol %, and a set solution temperature of 820° C.

Analysis of the cross sections of the composite materials of a YBCO film and a substrate prepared using the substrates a and b confirmed that reaction between the substrate and the solution was either almost non-existent, or if present, was light and localized.

In the case of the substrate a, measurement of the superconducting critical temperature for the YBCO film using a DC four terminal method revealed a value of 90 K for the produced YBCO film. In current-voltage measurements, a sample processed into a width of 0.33 mm produced a measured critical current of 4.5 A. This result corresponds with a value of 135 A for a 1 cm width.

To compare the above results with films formed at higher temperatures, when film formation was conducted at 850° C., cracks developed in the film, when film formation was conducted at 880° C., separation of the film was confirmed, and when film formation was conducted at 930° C., dissolution of the Hastelloy substrate was observed. From these results it is clear that temperature reduction enables a reduction in the reaction between the substrate and the solution, and a suppression of cracking.

INDUSTRIAL APPLICABILITY

A process for preparing a composite material of an oxide crystal film and a substrate according to the present invention is ideal for preparing a large surface area superconducting crystal film on a substrate, or preparing a long superconducting crystal film on a tape type substrate, and is very useful industrially.

What is claimed is:

1. A process for preparing a composite material of an oxide crystal film and a substrate, by bringing a substrate with a seed crystal film formed on a surface thereof into contact with a solution comprising elements for forming an oxide with a Y123 type crystal structure, and growing an oxide crystal film with a Y123 type crystal structure on said substrate, wherein a BaO—CuO—BaF$_2$ system or a BaO—CuO—Ag—BaF$_2$ system is used as a solvent for forming said solution, and a temperature of said solution is controlled to a temperature of no more than 850° C.

2. A process for preparing a composite material of an oxide crystal film and a substrate according to claim 1, wherein a Ba/Cu atom ratio in said solvent comprising said BaO—CuO—BaF$_2$ system or said BaO—CuO—Ag—BaF$_2$ system is within a range from 35/65 to 22/78.

3. A process for preparing a composite material of an oxide crystal film and a substrate according to claim 1, wherein an oxygen concentration in a crystal growing atmosphere is within a range from $5 \times 10^{-2}$ to 2 mol %.

4. A process for preparing a composite material of an oxide crystal film and a substrate according to claim 1, wherein said substrate uses a metal substrate formed from a metal selected from a group consisting of Ni, Ag, Ni based alloys, and Ag based alloys.

5. A process for preparing a composite material of an oxide crystal film and a substrate according to claim 3, wherein said substrate uses a metal substrate formed from a metal selected from a group consisting of Ni, Ag, Ni based alloys, and Ag based alloys.

6. A process for preparing a composite material of an oxide crystal film and a substrate according to claim 4, wherein said substrate uses a composite metal substrate comprising said metal substrate, with a core formed from an Fe based alloy or a Ni based alloy that is different from a material used in forming said metal substrate provided therein.

7. A process for preparing a composite material of an oxide crystal film and a substrate according to claim 5, wherein said substrate uses a composite metal substrate comprising said metal substrate, with a core formed from an Fe based alloy or a Ni based alloy that is different from a material used in forming said metal substrate provided therein.

8. A process for preparing a composite material of an oxide crystal film and a substrate according to claim 1, wherein said substrate uses a composite substrate in which an oxide film is formed on top of any one of: a metal selected from a group consisting of Ni, Ag, Ni based alloys, and Ag based alloys; a composite metal comprising said metal, with a core formed from a Ni based alloy that is different from said metal or an Fe based alloy provided therein; or a semiconductor comprising silicon and GaN, using a physical vapor deposition (PVD) method, a surface oxidation method or a chemical vapor deposition method, and using an oxide selected from a group consisting of MgO, LaAlO$_3$, Al$_2$O$_3$, SrTiO$_3$, yttria stabilized ZrO$_2$, CeO$_2$, Y$_2$O$_3$, and NiO is used as said substrate.

9. A process for preparing a composite material of an oxide crystal film and a substrate according to claim 2, wherein said substrate uses a composite substrate in which an oxide film is formed on top of any one of: a metal selected from a group consisting of Ni, Ag, Ni based alloys, and Ag based alloys; a composite metal comprising said metal, with a core formed from a Ni based alloy that is different from said metal or an Fe based alloy provided therein; or a semiconductor comprising silicon or GaN, using a physical vapor deposition (PVD) method, a surface oxidation method or a chemical vapor deposition method, and using an oxide selected from a group consisting of MgO, LaAlO$_3$, Al$_2$O$_3$, SrTiO$_3$, yttria stabilized ZrO$_2$, CeO$_2$, Y$_2$O$_3$, and NiO.

10. A process for preparing a composite material of an oxide crystal film and a substrate according to claim 1, wherein said substrate uses a non-metallic substrate formed from any one of MgO, LaAlO$_3$, Al$_2$O$_3$, SrTiO$_3$, Sr$_2$AlTaO$_6$, (La$_{1-x}$Sr$_x$)$_2$AlTaO$_6$ (wherein, $0 \leq x < 1$), yttria stabilized ZrO$_2$, CeO$_2$, Y$_2$O$_3$, NiO, Si$_3$N$_4$, or a combination thereof.

11. A process for preparing a composite material of an oxide crystal film and a substrate according to claim 2, wherein said substrate uses a non-metallic substrate formed from any one of MgO, LaAlO$_3$, Al$_2$O$_3$, SrTiO$_3$, Sr$_2$AlTaO$_6$, (La$_{1-x}$Sr$_x$)$_2$AlTaO$_6$ (wherein, $0 \leq x < 1$), yttria stabilized ZrO$_2$, CeO$_2$, Y$_2$O$_3$, NiO, Si$_3$N$_4$, or a combination thereof.

12. A process for preparing a composite material of an oxide crystal film and a substrate according to any one of claim 1 through claim 11, wherein a composition of said Y123 type crystal structure is represented by Ln$_{1+y}$Ba$_{2-y}$Cu$_3$O$_{6+d}$ (wherein, Ln represents a positive ion element selected from a group consisting of Y, La, Pr, Nd, Sm, Eu, Gd, Dy, Ho, Er, Tm, Yb, and Lu, $0 \leq y \leq 1$, and $0 \leq d \leq 1.5$).

13. A process for preparing a composite material of an oxide crystal film and a substrate according to any one of claim 1 through claim 11, wherein a composition of said Y123 type crystal structure is represented by:

(Y$_{x1}$Ca$_{x2}$La$_{x3}$Pr$_{x4}$Nd$_{x5}$Sm$_{x6}$Eu$_{x7}$Gd$_{x8}$Dy$_{x9}$Ho$_{x10}$Er$_{x11}$Tm$_{x12}$Yb$_{x13}$Lu$_{x14}$)$_{1+y}$Ba$_{2-y}$Cu$_3$O$_{6+d}$ (wherein, x1 to x14 are each at least 0, but no more than 1, x1+x2+ ... +x14=1, and at least two of x1 to x14 are values other than 0, $0 \leq y \leq 1$, and $0 \leq d \leq 1.5$).

14. A process for preparing a composite material of an oxide crystal film and a substrate according to any one of claim 1 through claim 11, wherein said seed crystal is a crystal film of: an oxide with a Y123 type crystal structure containing either an oxide with a composition represented by Ln$_{1+y}$Ba$_{2-y}$Cu$_3$O$_{6+d}$ (wherein, Ln represents a positive ion element selected from a group consisting of Y, La, Pr, Nd, Sm, Eu, Gd, Dy, Ho, Er, Tm, Yb, and Lu, $0 \leq y \leq 1$, and $0 \leq d \leq 1.5$), or an oxide with a composition represented by (Y$_{x1}$Ca$_{x2}$La$_{x3}$Pr$_{x4}$Nd$_{x5}$Sm$_{x6}$Eu$_{x7}$Gd$_{x8}$Dy$_{x9}$Ho$_{x10}$Er$_{x11}$Tm$_{x12}$Yb$_{x13}$Lu$_{x14}$)$_{1+y}$Ba$_{2-y}$Cu$_3$O$_{6+d}$ (wherein, x1 to x14 are each at least 0, but no more than 1, x1+x2+ ... +x14=1, and at least two of x1 to x14 are values other than 0, $0 \leq y \leq 1$, and $0 \leq d \leq 1.5$); an oxide with a K$_2$NiF$_4$ type structure containing an oxide represented by La$_2$CuO$_4$, Nd$_2$CuO$_4$, LaSrFeO$_4$, or LaSrGaO$_4$; an oxide with a perovskite type structure containing an oxide represented by NdGaO$_3$ or LaGaO$_3$; or an oxide containing Y—Ba$_2$Fe$_2$O$_5$, which represents a solid state solution of a rare earth element in Ba$_2$Fe$_2$O$_5$.

15. A solution for use in a process for preparing a composite material of an oxide crystal film and a substrate by bringing a substrate with a seed crystal film formed on a surface thereof into contact with a solution comprising elements for forming an oxide with a Y123 type crystal structure and growing an oxide crystal film with a Y123 type crystal structure on said substrate, wherein a solvent used to form said solution is a BaO—CuO—BaF$_2$ system or a BaO—CuO—Ag—BaF$_2$ system, and a Ba/Cu atom ratio of said solvent is within a range from 35/65 to 22/78.

16. A solution for use in a process for preparing a composite material of an oxide crystal film and a substrate according to claim 15, wherein a BaF$_2$ molar percentage in said solvent is within a range from $5 \times 10^{-2}$ to 2 mol %.

17. A solution for use in a process for preparing a composite material of an oxide crystal film and a substrate according to either one of claim 15 and claim 16, wherein a concentration of Ag in said solvent is a saturated concentration at a film formation temperature for said oxide crystal film.

* * * * *